(12) United States Patent
Chen et al.

(10) Patent No.: US 6,974,989 B1
(45) Date of Patent: Dec. 13, 2005

(54) STRUCTURE AND METHOD FOR PROTECTING MEMORY CELLS FROM UV RADIATION DAMAGE AND UV RADIATION-INDUCED CHARGING DURING BACKEND PROCESSING

(75) Inventors: Cinti X. Chen, Fremont, CA (US); Boon-Yong Ang, Cupertino, CA (US); Hajime Wada, San Jose, CA (US); Sameer S. Haddad, San Jose, CA (US); Inkuk Kang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 37 days.

(21) Appl. No.: 10/841,933

(22) Filed: May 6, 2004

(51) Int. Cl.[7] ............................................ H01L 27/108
(52) U.S. Cl. ................ 257/296; 257/635; 257/637; 257/649; 438/689; 438/744; 438/724; 438/795
(58) Field of Search ................ 257/296–310, 257/635, 637, 649; 438/689, 744, 724, 795

Primary Examiner—Fetsum Abraham
(74) Attorney, Agent, or Firm—Farjami & Farjami LLP

(57) ABSTRACT

According to one exemplary embodiment, a structure comprises a substrate. The structure further comprises at least one memory cell situated on the substrate. The structure further comprises a first interlayer dielectric layer situated over the at least one memory cell and over the substrate. The structure further comprises an oxide cap layer situated on the first interlayer dielectric layer. According to this exemplary embodiment, the structure further comprises an etch stop layer comprising TCS nitride situated on the oxide cap layer, where the etch stop layer blocks UV radiation. The structure further comprises a second interlayer dielectric layer situated on the etch stop layer. The structure may further comprise a trench situated in the second interlayer dielectric layer and the etch stop layer, where the trench is filled with copper. The structure may further comprise an anti-reflective coating layer situated on the second interlayer dielectric layer.

20 Claims, 2 Drawing Sheets

STRUCTURE AND METHOD FOR PROTECTING MEMORY CELLS FROM UV RADIATION DAMAGE AND UV RADIATION-INDUCED CHARGING DURING BACKEND PROCESSING

TECHNICAL FIELD

The present invention is generally in the field of semiconductor fabrication. More specifically, the present invention is in the field of fabrication of memory cells.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash memory devices are similar to EEPROM devices in that memory cells can be programmed and erased electrically. However, flash memory devices enable the erasing of all memory cells in the device using a single current pulse.

During flash memory device fabrication, memory cells are typically formed on a silicon substrate. The memory cells can be, for example, Silicon-Oxide-Nitride-Oxide-Silicon ("SONOS") memory cells, such as Advanced Micro Devices' ("AMD") MirrorBit™ memory cell, or floating gate memory cells. After the memory cells have been formed, various dielectric layers, such as an interlayer dielectric ("ILD") layer, are typically formed over the memory cells. Contact holes can be etched into the ILD and oxide cap layers and filled with metal, such as tungsten, to form contacts over active doped regions in the substrate or in a polysilicon layer. Additional dielectric layers, such as an etch stop layer and a second ILD layer, can be formed over the contacts. During backend processing, such as copper back-end-of-line ("BEOL") processing, trenches and vias can be formed over the contacts in the second ILD layer and the trenches and vias can be filled with a metal, such as copper. Interconnect metal lines can then be appropriately formed over the metal-filled trenches and vias to provide electrical connections to the active regions.

However, backend processing utilized to form metal-filled trenches and vias, interconnect metal lines, and dielectric layers, typically includes processes such as plasma etching and chemical vapor deposition ("CVD"), which produce ultraviolet ("UV") radiation. The UV radiation produced during the above back end processes can alter the memory cells and cause UV radiation damage to the flash memory device, which decreases memory cell reliability. The UV radiation can also cause UV radiation-induced charging in dielectric layers in and adjacent to the memory cells, such as gate spacers and Oxide-Nitride-Oxide ("ONO") stack layers, which can reduce data retention. The UV radiation-induced charging can degrade data retention and can undesirably increase threshold voltage ("Vt") in the flash memory cell, which decreases memory cell performance. In floating gate flash memory cells, UV radiation-induced charging can be reduced by performing a UV erase step after appropriate back end processes. However, the UV erase steps undesirably increase manufacturing cost. In the case of MirrorBit™ memory cells, adding additional UV erase steps can not reduce charging because its program/erase mechanisms used in devices are different from floating gate memory cells. UV erase steps can only charge up MirrorBit™ memory cells even more, not reduce the UV charging damage or lower Vt.

Thus, there is a need in the art for an effective structure and method to prevent UV radiation produced during backend processing from deleteriously affecting memory cells, such as SONOS or floating gate flash memory cells.

SUMMARY

The present invention is directed to structure and method for protecting memory cells from UV radiation damage and UV radiation-induced charging during backend processing. The present invention addresses and resolves the need in the art for an effective structure and method to prevent UV radiation produced during backend processing from deleteriously affecting memory cells, such as SONOS or floating gate flash memory cells.

According to one exemplary embodiment, a structure comprises a substrate. The structure further comprises at least one memory cell situated on the substrate. The at least one memory cell may be, for example, a floating gate flash memory cell or a SONOS flash memory cell. The structure further comprises a first interlayer dielectric layer situated over the at least one memory cell and over the substrate. The first interlayer dielectric layer may be BPSG, for example. The structure further comprises an oxide cap layer situated on the first interlayer dielectric layer. The oxide cap layer may be, for example, undoped TEOS oxide.

According to this exemplary embodiment, the structure further comprises an etch stop layer situated on the oxide cap layer, where the etch stop layer comprises TCS nitride, and where the etch stop layer blocks UV radiation. The structure further comprises a second interlayer dielectric layer situated on the etch stop layer. The structure may further comprise a trench situated in the second interlayer dielectric layer and the etch stop layer, where the trench is filled with copper. The structure may further comprise an anti-reflective coating ("ARC") layer situated on the second interlayer dielectric layer. According to one embodiment, the invention is a method for achieving the above-described structure. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for protecting memory cells from UV radiation damage and UV radiation-induced charging during backend processing. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves the utilization of an etch stop layer comprising tetrachlorosilane ("TCS") nitride, which effectively protects memory cells from the adverse effects of UV radiation produced during backend processing, such as copper BEOL processing. The present invention can be applied to any non-volatile memory, including flash memory. Although floating gate flash memory cells are utilized to illustrate the present invention, the present invention can also be applied to SONOS flash memory cells, such as an AMD MirrorBit™ flash memory cell.

Figure 1:
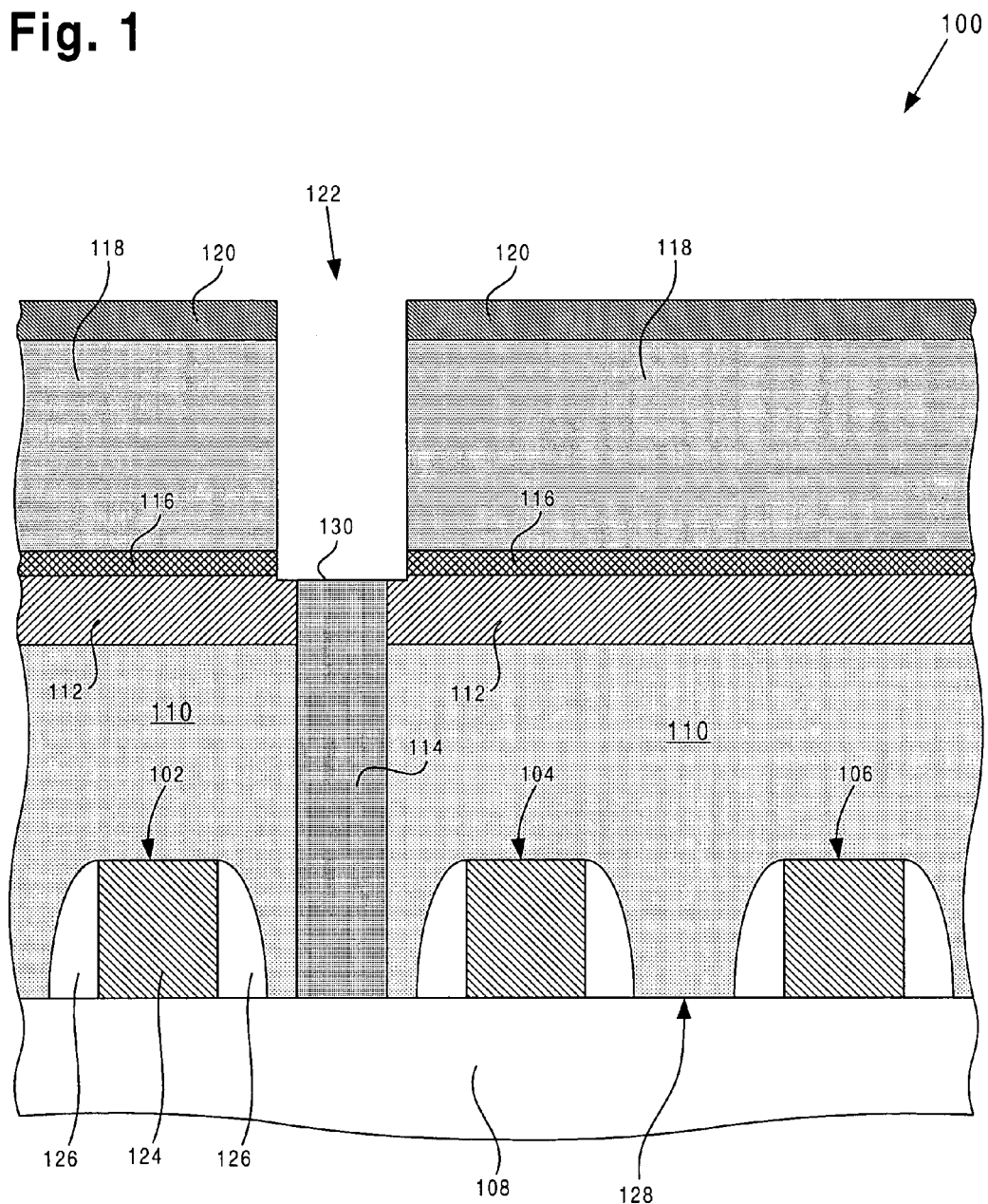
FIG. 1 illustrates a cross-sectional view of a structure including exemplary memory cells, in accordance with one embodiment of the present invention.

FIG. 1 shows a cross-sectional view of an exemplary structure in accordance with one embodiment of the present invention. Structure 100 includes memory cells 102, 104, and 106, substrate 108, interlayer dielectric ("ILD") layer 110, oxide cap layer 112, contact 114, etch stop layer 116, ILD layer 118, anti-reflective coating ("ARC") layer 120, and trench 122. Structure 100 can be, for example, part of a non-volatile memory array, such as a flash memory array. Memory cell 102 includes stacked gate structure 124, gate spacers 126, and source and drain regions (not shown in FIG. 1). In the present embodiment, memory cell 102 can be a floating gate flash memory cell. In one embodiment, memory cell 102 may be a SONOS flash memory cell, such as an AMD MirrorBit™ flash memory cell.

As shown in FIG. 1, memory cell 102 includes stacked gate structure 124, which is situated on top surface 128 of substrate 108. Stacked gate structure 124 can comprise a control gate, an ONO stack, a floating gate, and a tunnel oxide layer, which are not shown in FIG. 1, and can be formed in a manner known in the art. Also shown in FIG. 1, gate spacers 126 are situated on the sides of stacked gate structure 124 and on top surface 128 of substrate 108. Gate pacers 126 can comprise a dielectric material, such as silicon dioxide or silicon nitride, and can be formed by depositing the dielectric material over stacked gate structure 124 and anisotropically etching the dielectric material. It is noted that although only memory cell 102 is described in detail herein to preserve brevity, memory cells 104 and 106 are similar to memory cell 102 in composition and manner of fabrication.

Further shown in FIG. 1, ILD layer 110 is situated over memory cells 102, 104, and 106 and over substrate 108. In the present embodiment, ILD layer 110 can comprise borophosphosilicate glass ("BPSG") and can be deposited over memory cells 102, 104, and 106 and over substrate 108 by using a CVD process or plasma enhanced chemical vapor deposition ("PECVD") process. In another embodiment, ILD layer 110 can comprise silicon dioxide or other appropriate dielectric material. By way of example, ILD layer 110 can have a thickness of approximately 5000.0 Angstroms. Also shown in FIG. 1, oxide cap layer 112 is situated over ILD layer 110 and can comprise undoped TEOS oxide or other appropriate oxide. By way of example, oxide cap layer 112 can have a thickness of approximately 1000.0 Angstroms and can be deposited using a CVD or PECVD process.

Also shown in FIG. 1, contact 114 is situated between memory cells 102 and 104 on substrate 108 and extends through oxide cap layer 112 and ILD layer 110. Contact 114 can comprise tungsten or other appropriate metal and can be formed by etching a contact hole in oxide cap layer 112 and ILD layer 110 using a plasma etch. The contact hole can then be filled with tungsten or other appropriate metal to form contact 114. Further shown in FIG. 1, etch stop layer 116 is situated on oxide cap layer 112 and comprises TCS nitride, which can be deposited on oxide cap layer 112 by using a CVD process or other appropriate process. By way of example, etch stop layer 116 can have a thickness of approximately 300.0 Angstroms.

In addition to providing an etch stop for subsequent etch processes, the present invention utilizes etch stop layer 116 to block UV radiation produced by subsequent backend processes, such as plasma etching and CVD processes. By blocking UV radiation that is produced during subsequent backend processing, such as copper BEOL processing, the present invention advantageously achieves reduced UV radiation-induced charging in dielectric layers in and adjacent to memory cells 102, 104, and 106, which can improve memory cell data retention. Also, by blocking UV radiation, the present invention advantageously prevents UV radiation from damaging memory cells 102, 104, and 106. Furthermore, in the present embodiment, which utilizes floating gate memory cells, the present invention eliminates the need for providing a UV erase step after appropriate backend processes to counteract the effects of UV radiation-induced charging, which advantageously reduces manufacturing cost.

In contrast to the present invention, in conventional memory device backend processing, such as copper BEOL processing, dichlorosilane ("DCS") nitride is utilized in a conventional etch stop layer. However, a conventional DCS nitride etch stop layer does not provide UV radiation blocking. Additionally, TCS nitride can have a low dielectric constant ("low-k"). Since the capacitance of a dielectric layer is proportional to the dielectric constant of the dielectric layer, by utilizing low-k TCS nitride, the present invention advantageously achieves an etch stop layer having reduced capacitance compared to a conventional etch stop layer comprising DCS nitride.

Further shown in FIG. 1, ILD layer 118 is situated on etch stop layer 116 and can comprise TEOS, fluorinated TEOS, or other appropriate dielectric material. ILD layer 118 can be deposited on etch stop layer 116 by using a CVD or PECVD process. By way of example, ILD layer 118 can have a thickness of between approximately 2500.0 Angstroms and approximately 3500.0 Angstroms. Also shown in FIG. 1, ARC layer 120 is situated on ILD layer 118. ARC layer 120 can comprise silicon oxynitride ("SiON") or other appropriate dielectric and may be deposited on ILD layer 118 by using, for example, a CVD or PECVD process. By way of example, ARC layer 120 can have a thickness of between approximately 300.0 Angstroms and approximately 600.0 Angstroms.

Further shown in FIG. 1, trench 122 is situated in and extends through ARC layer 120, ILD layer 118, and etch stop layer 116. Trench 122 can be formed, for example, by depositing and patterning a layer of photoresist on ARC layer 120 to define a trench opening. ARC layer 120, ILD layer 118, and etch stop layer 116 can then be etched using a plasma etch to form trench 122, which exposes top surface 130 of contact 114. During the formation of trench 122, etch stop layer 116 can be over-etched to ensure that the portion of etch stop layer 116 in trench 122 is completely removed. Trench 122 can be filled with a metal, such as copper, by depositing a layer of metal over trench 122 using an appropriate deposition process. Excess metal, such as copper, deposited over trench 122 can be removed by using a chemical mechanical polish ("CMP") process, which provides a substantially planar surface over trench 122. In subsequent backend processing steps, an interconnect metal line can be formed on the metal-filled trench, i.e. trench 122, by depositing and patterning an interconnect metal layer, which can comprise copper, on ARC layer 120. As a result, the interconnect metal line can be electrically connected to contact 114 by the metal-filled trench, i.e. trench 122.

Figure 2:
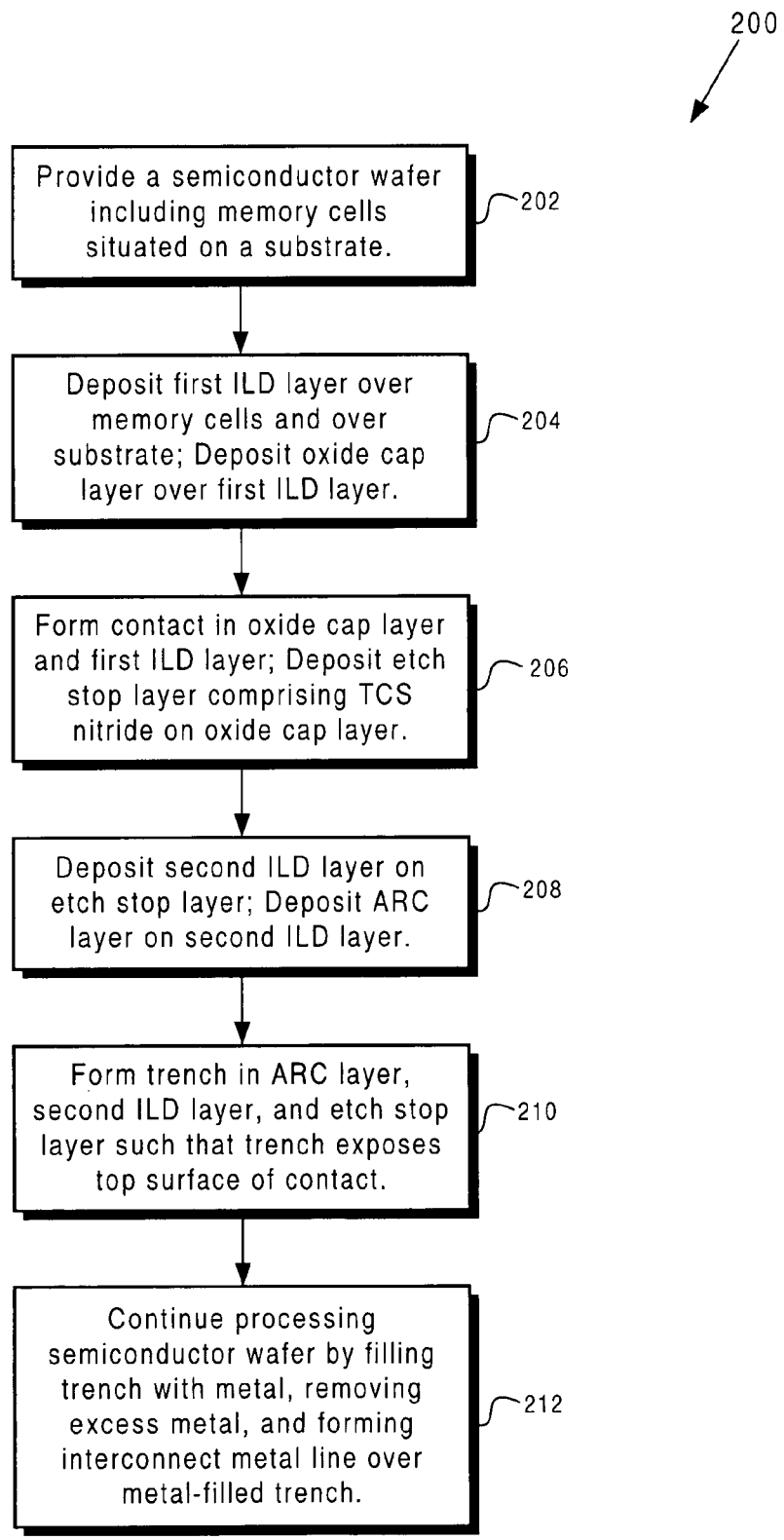
FIG. 2 is a flowchart corresponding to exemplary method steps according to one embodiment of the present invention.

FIG. 2 shows a flowchart illustrating an exemplary method according to one embodiment of the present invention. Certain details and features have been left out of flowchart 200 that are apparent to a person of ordinary skill in the art. For example, a step may consist of one or more substeps or may involve specialized equipment or materials, as known in the art. At step 202, a semiconductor wafer is provided, which includes memory cells, such as memory cells 102, 104, and 106, situated on a substrate, such as substrate 108. In the present embodiment, memory cells 102, 104, and 106 can be floating gate flash memory cells. In one embodiment, memory cells 102, 104, and 106 can be SONOS flash memory cells.

At step 204, a first ILD layer, such as ILD layer 110, is deposited over the memory cells and over the substrate, and an oxide cap layer, such as oxide cap layer 112, is deposited over the first ILD layer. For example, ILD layer 110 can be deposited over memory cells 102, 104, and 106 and over substrate 108 using a CVD or PECVD process and oxide cap layer 112 can be deposited over ILD layer 110 using a CVD or PECVD process. By way of example, ILD layer 110 can comprise BPSG and oxide cap layer 112 can comprise undoped TEOS oxide. At step 206, a contact is formed in the oxide cap layer and the first ILD layer and an etch stop layer comprising TCS nitride is deposited on the oxide cap layer. For example, contact 114 can be formed by etching a contact hole in oxide cap layer 112 and ILD layer 110 and filling the contact hole with tungsten. For example, etch stop layer 116, which comprises TCS nitride, can be deposited on oxide cap layer 112 by using a CVD process. At step 208, a second ILD layer is deposited on the etch stop layer and an ARC layer is deposited on the second ILD layer. For example, ILD layer 118 can be deposited on etch stop layer 116 by using a CVD or PECVD process and ARC layer 120 can be deposited on ILD layer 118 by using a CVD or PECVD process. For example, ILD layer 118 can comprise TEOS and ARC layer 120 can comprise silicon oxynitride. At step 210, a trench is formed in the ARC layer, the second ILD layer, and the etch stop layer such that the trench exposes the top surface of the contact. For example, trench 122 can be etched in ARC layer 120, ILD layer 118, and etch stop layer 116 by using a plasma etch process such that trench 122 exposes top surface 130 of contact 114. At step 212, processing of the semiconductor wafer continues by filling the trench with metal, removing excess metal over the trench, and forming an interconnect metal line over the metal-filled trench. For example, trench 122 can be filled with copper by depositing a layer of copper over trench 122 using an appropriate deposition process and excess copper deposited over trench 122 can be removed using a CMP process. For example, an interconnect metal line (not shown in FIG. 1) can be formed over trench 122 by depositing and patterning a layer of copper over ARC layer 120 and trench 122.

Thus, as discussed above, by utilizing an etch stop layer comprising TCS nitride, the present invention prevents UV radiation produced during backend processing, such as copper BEOL processing, from deleteriously affecting memory cells situated below the etch stop layer. As a result, the present invention advantageously reduces charging caused by UV radiation and improves memory cell data retention. The present invention also advantageously provides an etch stop layer having reduced capacitance compared to a conventional etch stop layer comprising DCS nitride.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure and method for protecting memory cells from UV radiation damage and UV radiation-induced charging during backend processing have been described.

What is claimed is:

1. A structure comprising:

a substrate;

at least one memory cell situated on said substrate;

a first interlayer dielectric layer situated over said at least one memory cell and over said substrate;

an oxide cap layer situated on said first interlayer dielectric layer;

an etch stop layer situated on said oxide cap layer, said etch stop layer comprising TCS nitride;

wherein said etch stop layer blocks UV radiation.

2. The structure of claim 1 further comprising a second interlayer dielectric layer situated on said etch stop layer.

3. The structure of claim 2 further comprising an anti-reflective coating layer situated on said second interlayer dielectric layer.

4. The structure of claim 2 further comprising a trench situated in said second interlayer dielectric layer and said etch stop layer, said trench being filled with copper.

5. The structure of claim 1 wherein said oxide cap layer comprises undoped TEOS oxide.

6. The structure of claim 1 wherein said first interlayer dielectric layer comprises BPSG.

7. The structure of claim 1 wherein said at least one memory cell is a floating gate flash memory cell.

8. The structure of claim 1 wherein said at least one memory cell is a SONOS flash memory cell.

9. A structure comprising a substrate, at least one memory cell situated on said substrate, a first interlayer dielectric layer situated over said at least one memory cell and over said substrate, an oxide cap layer situated on said first interlayer dielectric layer, said structure being characterized in that:

an etch stop layer is situated on said oxide cap layer, said etch stop layer comprising TCS nitride, wherein said etch stop layer blocks UV radiation.

10. The structure of claim 9 further comprising a second interlayer dielectric layer situated on said etch stop layer.

11. The structure of claim 10 further comprising an anti-reflective coating layer situated on said second interlayer dielectric layer.

12. The structure of claim 10 further comprising a trench situated in said second interlayer dielectric layer and said etch stop layer, said trench being filled with copper.

13. The structure of claim 9 wherein said first interlayer dielectric layer comprises BPSG.

14. The structure of claim 9 wherein said at least one memory cell is selected from the group consisting of a floating gate flash memory cell and a SONOS flash memory cell.

15. A method comprising steps of:
depositing a first interlayer dielectric layer over at least one memory cell situated on a substrate;
depositing an oxide cap layer on said first interlayer dielectric layer;
depositing an etch stop layer on said oxide cap layer, said etch stop layer comprising TCS nitride;
wherein said etch stop layer blocks UV radiation.

16. The method of claim 15 further comprising a step of depositing a second interlayer dielectric layer on said etch stop layer.

17. The method of claim 16 further a step of depositing an anti-reflective coating layer on said second interlayer dielectric layer.

18. The method of claim 16 further comprising steps of:
etching a trench in said second interlayer dielectric layer and said etch stop layer;
filling said trench with copper.

19. The method of claim 15 wherein said first interlayer dielectric layer comprises BPSG.

20. The method of claim 15 wherein said at least one memory cell is selected from the group consisting of a floating gate flash memory cell and a SONOS flash memory cell.

* * * * *